United States Patent
Liu et al.

(10) Patent No.: US 8,164,124 B2
(45) Date of Patent: Apr. 24, 2012

(54) PHOTODIODE WITH MULTI-EPI FILMS FOR IMAGE SENSOR

(75) Inventors: Jen-Cheng Liu, Hsin Chu (TW);
Dun-Nian Yaung, Taipei (TW);
Jyh-Ming Hung, Changhua (TW);
Wen-De Wang, Chiayi County (TW);
Chun-Chieh Chuang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 248 days.

(21) Appl. No.: 11/752,012

(22) Filed: May 22, 2007

(65) Prior Publication Data

US 2008/0246063 A1 Oct. 9, 2008

Related U.S. Application Data

(60) Provisional application No. 60/909,970, filed on Apr. 4, 2007.

(51) Int. Cl.
*H01L 29/76* (2006.01)

(52) U.S. Cl. ........ 257/288; 257/290; 257/479; 257/449; 257/E33.076

(58) Field of Classification Search ................... 257/592, 257/288, 290, 479, 449, E33.076
See application file for complete search history.

(56) References Cited

U.S. PATENT DOCUMENTS

| | | | | |
|---|---|---|---|---|
| 6,521,920 | B2 * | 2/2003 | Abe | 257/223 |
| 6,784,489 | B1 * | 8/2004 | Menegoli | 257/343 |
| 6,979,587 | B2 * | 12/2005 | Lee | 438/57 |
| 2006/0022292 | A1 * | 2/2006 | Shenoy | 257/472 |
| 2006/0125947 | A1 * | 6/2006 | Packer et al. | 348/340 |
| 2006/0194391 | A1 * | 8/2006 | Saggio et al. | 438/268 |
| 2007/0020893 | A1 * | 1/2007 | Ueno et al. | 438/479 |
| 2007/0131992 | A1 * | 6/2007 | Dosluoglu et al. | 257/292 |

OTHER PUBLICATIONS

Chinese Patent Office, Chinese Office Action, Jul. 24, 2009, 6 Pages, Application No. 008100053003.

* cited by examiner

*Primary Examiner* — Matthew Reames
*Assistant Examiner* — Elias M Ullah
(74) *Attorney, Agent, or Firm* — Haynes and Boone, LLP

(57) ABSTRACT

The present disclosure provides an image sensor semiconductor device. The semiconductor device includes a semiconductor substrate; a first epitaxy semiconductor layer disposed on the semiconductor substrate and having a first type of dopant and a first doping concentration; a second epitaxy semiconductor layer disposed over the first epitaxy semiconductor layer and having the first type of dopant and a second doping concentration less than the first doping concentration; and an image sensor on the second epitaxy semiconductor layer.

20 Claims, 3 Drawing Sheets

PHOTODIODE WITH MULTI-EPI FILMS FOR IMAGE SENSOR

CROSS-REFERENCE

This application claims the benefit of U.S. Provisional Application No. 60/909,970 entitled "PHOTODIODE WITH MULTI-EPI FILMS FOR IMAGE SENSOR," filed Apr. 4, 2007, herein incorporated by reference in its entirety.

BACKGROUND

In semiconductor technologies, image sensors are used for sensing a volume of exposed light projected towards the semiconductor substrate. Complementary metal-oxide-semiconductor (CMOS) image sensor devices are widely used in various applications such as digital still camera (DSC) applications. These devices utilize an array of active pixels or image sensor cells, including photodiode and MOS transistors, to collect photo energy to convert images to streams of digital data. However, when image sensor pixels get smaller and smaller in advanced technology nodes, existing image sensor devices suffer various issues including degraded sensitivity, image lag and electrical cross-talk. Improvements of the image sensor and the corresponding substrate are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
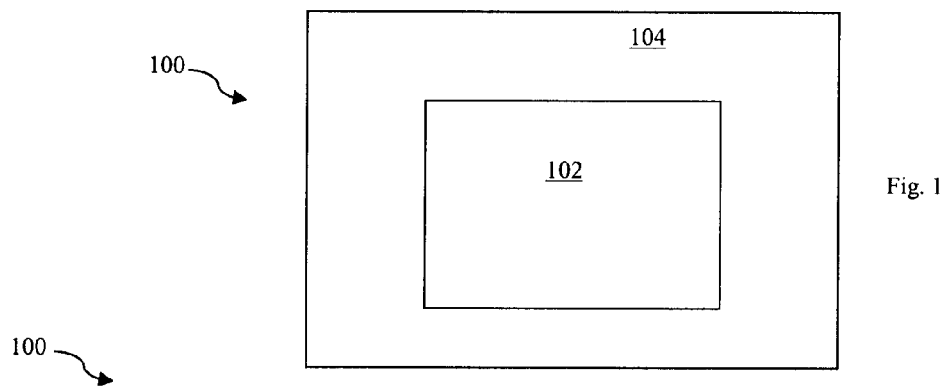
FIG. 1 is a top view of an image sensing semiconductor device constructed according to aspects of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, an image sensor device 100 is shown according to one embodiment of the present invention. The device includes a pixel area 102 and a peripheral area 104. In the present embodiment, the pixel area includes a plurality of complementary metal-oxide-semiconductor (CMOS) image sensors. In addition or in the alternative, a plurality of charge-coupled device (CCD) sensors, active-pixel sensors, and passive-pixel sensors may be provided.

Figure 2:
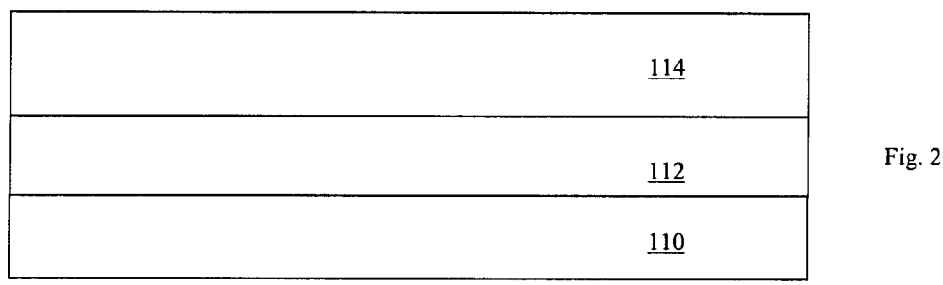
FIGS. 2-3 are cross-sectional views of the image sensing semiconductor device of FIG. 1 at various fabrication stages constructed according to one embodiment of the present disclosure.

Referring to FIG. 2, the device 100 includes a semiconductor substrate 110 having a first type of dopant in the pixel area 102. In the present embodiment, the semiconductor substrate 110 includes silicon. The substrate 110 may alternatively or additionally include other elementary semiconductor such as germanium. The substrate 110 may also include a compound semiconductor such as silicon carbide, gallium arsenic, indium arsenide, and indium phosphide. In one example, the first type of dopant is negative-type (N-type) dopants in one embodiment. The substrate 110 of the N-type dopants is doped by phosphorus or arsenic. The substrate 110 may be heavily doped. In one embodiment, the substrate 110 has a dopant concentration greater than about $10^{18}$ cm$^{-3}$. The doping may be implemented using a process such as ion implantation or diffusion in various steps and techniques. The N-type doped semiconductor substrate 110 is described here as an example of the semiconductor device 100 in the following description. In another embodiment, a P-type doped semiconductor substrate may be alternatively used if the first type of dopant is positive-type (P-type) and the following doped features are changed accordingly.

A first semiconductor layer 112 having the first type of dopant is formed on the semiconductor substrate 110. The semiconductor layer 112 may be also a silicon layer if the semiconductor substrate 110 is a silicon substrate. The first semiconductor layer 112 may have a proper thickness and a dopant concentration less than the doping concentration of the semiconductor substrate 110. In one embodiment, the first semiconductor layer 112 may have a thickness greater than about 0.2 micrometer. In another embodiment, the first semiconductor layer 112 may have a thickness greater than about 0.5 micrometer. Preferably, the first semiconductor layer 112 has a thickness ranging between about 0.2 and about 10 micrometer. The semiconductor layer 112 may have a first doping concentration ranging between about $10^{16}$ cm$^{-3}$ and about $10^{18}$ cm$^{-3}$. The first semiconductor layer 112 is formed by an epitaxy growth of a layer of crystalline silicon on the silicon substrate or other semiconductor material. In one embodiment, the epitaxy growth of the silicon layer may be implemented by utilizing a silane (SiH$^4$) gas. In furtherance of the embodiment, the silane gas has a temperature ranging between about 800° C. and about 1300° C., and a gas pressure ranging between about 40 and about 760 Torr. The epitaxy growth may further utilize another gas (or gases) with a proper pressure to introduce dopants. For example, the epitaxy growth may include PH$_3$ to introducing N-type dopants. In another example, when the first type dopant is P-type, then B$_2$H$_6$ may be introduced into the epitaxy growth to form the P-doped epitaxy semiconductor layer 112. In the above embodiments, the dopants are introduced into the first semiconductor layer 112 by in-situ epitaxy growth. Alternatively, the dopants may be introduced by an ion implantation or diffusion with proper dose after the semiconductor layer 112 is formed.

Still referring to FIG. 2, a second semiconductor layer 114, having the first type of dopant and a second doping concentration less than the first doping concentration of the first semiconductor layer 112, is formed on the first semiconductor substrate 112. For example, when the first semiconductor layer 112 is N-type doped, then the second semiconductor layer 114 is also N-type. Phosphorus or arsenic may be utilized to introduce N-type dopants. The second semiconductor layer 114 is a silicon layer if the first semiconductor layer 112 is a silicon layer. The second semiconductor layer 114 may have a proper thickness and a dopant concentration less than the doping concentration of the first semiconductor layer 112. In one embodiment, the second semiconductor layer 114 has a thickness similar to that of the first semiconductor layer 112. For example, the second semiconductor layer 114 has a thickness greater than about 0.2 micrometer. In another example, the second semiconductor layer 114 has a thickness greater than about 0.5 micrometer. Preferably, the second semiconductor layer 114 has a thickness ranging between about 0.2 and about 10 micrometer. The second doping concentration in the second semiconductor layer 114 has a range between about $10^{13}$ cm$^{-3}$ and about $10^{15}$ cm$^{-3}$. The second semiconductor layer 114 is formed by an epitaxy growth of a layer of crystalline silicon on the first semiconductor layer 112. The epitaxy growth process utilized to form the second semiconductor layer 114 may be substantially similar to the epitaxy growth process to form the first semiconductor layer 112 but tuned to incorporate the second doping concentration. In one embodiment, the epitaxy growth of the silicon layer may be implemented by utilizing a silane (SiH$^4$) gas. In furtherance of the embodiment, the silane gas is introduced in a temperature ranging between about 800° C. and about 1300° C., and a gas pressure ranging between about 40 and about 760 Torr. The epitaxy growth may further utilize another gas (or gases) with a proper pressure to introduce dopants. For example, the epitaxy growth may include PH$_3$ to introducing N-type dopants. In another example, when the first type dopant is P-type, then B$_2$H$_6$ may be introduced into the epitaxy growth to form the P-doped epitaxy semiconductor layer 114. In the above embodiments, the dopants are introduced into the second semiconductor layer 114 by in-situ epitaxy growth. Alternatively, the dopants may be introduced by an ion implantation or diffusion with proper dose after the semiconductor layer is formed by the epitaxy growth.

Figure 4:
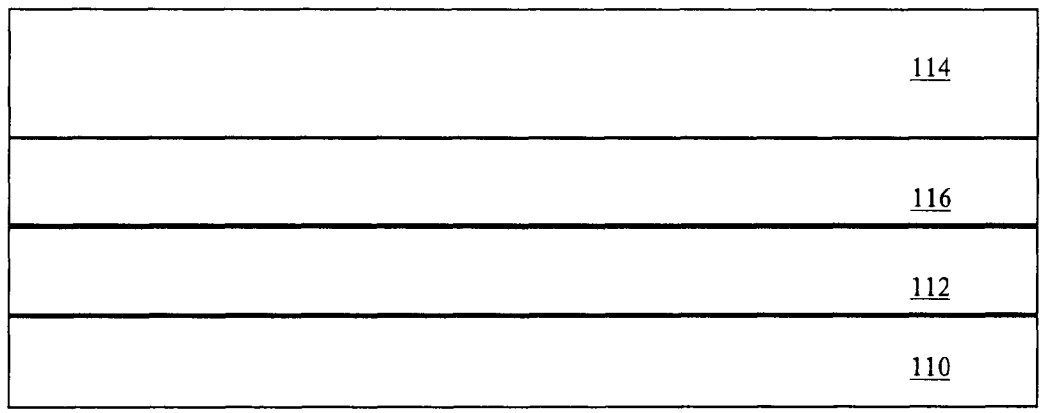
FIGS. 4-5 are cross-sectional views of an image sensing semiconductor device at various fabrication constructed according to aspects of the present disclosure.

Referring now to FIG. 4, alternatively, additional semiconductor layers may be used for the semiconductor device 100. Before forming of the second semiconductor layer 114, a third semiconductor layer 116 may be formed and disposed on the first semiconductor layer 112 with the first type of dopant and with a third doping concentration. In this situation, the semiconductor layer 114 is formed on the third semiconductor layer 116 thereafter. The third doping concentration is less than the first doping concentration of the first semiconductor layer 112 and greater than the second doping concentration of the second semiconductor layer 114. In one embodiment, the third doping concentration in the third semiconductor layer 116 may range between about $10^{14}$ cm$^{-3}$ and about $10^{16}$ cm$^{-3}$. The third semiconductor layer 116 is a silicon layer if the first semiconductor layer 112 is a silicon layer. The third semiconductor layer 116 may have a proper thickness. In one embodiment, the third semiconductor layer 116 may have a thickness similar to that of the first semiconductor layer 112 and/or that of the second semiconductor layer 114. For example, the third semiconductor layer 116 has a thickness greater than about 0.2 micrometer. In another example, the third semiconductor layer 116 has a thickness greater than about 0.5 micrometer. Preferably, the third semiconductor layer 116 may have a thickness ranging between about 0.2 and about 10 micrometer. Similarly, the third semiconductor layer 116 is formed by an epitaxy growth of a layer of crystalline silicon on the first semiconductor layer 112. The epitaxy growth process utilized to form the third semiconductor layer 116 may be substantially similar to the epitaxy growth process to form the first semiconductor layer 112 but tuned to incorporate the third doping concentration. In one embodiment, the epitaxy growth of the silicon layer may be implemented by utilizing a silane (SiH$^4$) gas. The epitaxy growth may further utilize another gas (or gases) with a proper pressure to introduce dopants. The dopants are introduced into the third semiconductor layer 116 by in-situ epitaxy growth. Alternatively, the dopants may be introduced by an ion implantation or diffusion with proper dose after the third semiconductor layer is formed by the epitaxy growth.

Figure 5:
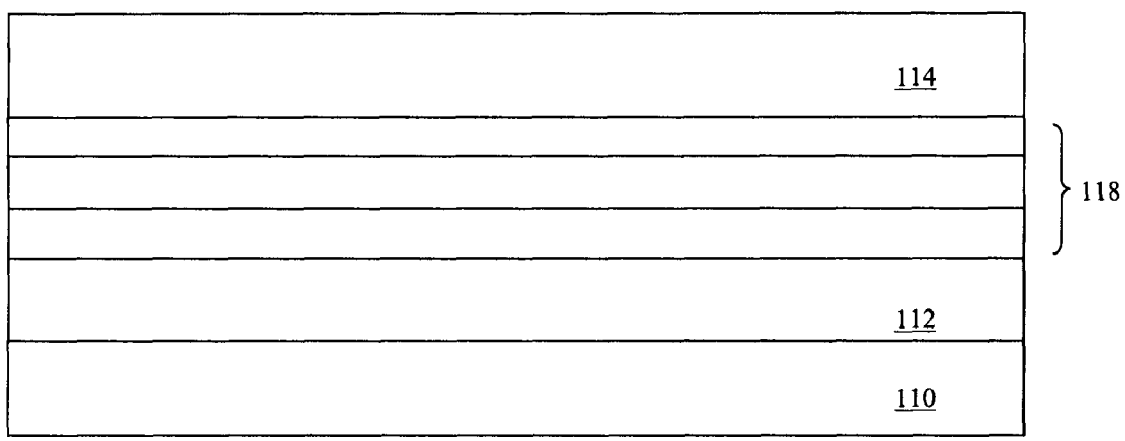

Referring to FIG. 5, other embodiments of the device 100 include two or more semiconductor layers, each with a different doping concentration, formed between the first and second semiconductor layers such as multiple semiconductor layers 118 as illustrated in FIG. 5. The multiple semiconductor layers 118 may be formed on the first semiconductor layer 112 before the forming of the second semiconductor layer 114. In this situation, the semiconductor layer 114 is formed on the multiple semiconductor layers 118 thereafter. The multiple semiconductor layers 118 are disposed between the first and second semiconductor layers 112 and 114 with the first type of dopant. The doping concentrations of the multiple semiconductor layers 118 ranges between the first doping concentration of the first semiconductor layer 112 and the second doping concentration of the second semiconductor layer 114. In one embodiment, the doping concentrations in the multiple semiconductor layers 118 may range between about $10^{14}$ cm$^{-3}$ and about $10^{16}$ cm$^{-3}$. In another embodiment, each layer of the multiple semiconductor layers 118 has one particular doping concentration less than that of its underlying neighbor semiconductor layer and greater than that of its overlying neighbor semiconductor layer. Each layer of the multiple semiconductor layers 118 may have a thickness similar to or less than that of the first semiconductor layer 112. For example, each layer of the multiple semiconductor layers 118 has a thickness greater than about 0.2 micrometer. In another example, each layer of the multiple semiconductor layers 118 has a thickness greater than about 0.5 micrometer. Preferably, each layer has a thickness ranging between about 0.2 and about 10 micrometer. Similarly, the multiple semiconductor layers 118 are formed by an epitaxy growth in multiple steps. The epitaxy growth process utilized to form the multiple semiconductor layers 118 may be substantially similar to the epitaxy growth process to form the first semiconductor layer 112 but tuned to incorporate various doping concentrations in multiple steps.

As described above, various embodiments utilize two or more semiconductor layers with graded doping concentration. The first and second semiconductor layers 112 and 114, or the first and second semiconductor layers with additional third semiconductor layer 116 or with additional multiple semiconductor layers 118 form a graded doping profile such that the doping concentration decreases vertically from the first semiconductor layer 112 to the second semiconductor layer 114 such that to form various image sensors with higher imaging efficiency, less crosstalk and reduced image lag. As a further embodiment to the above disclosed plurality of semiconductor layers utilizing the epitaxy growth, one alternative is one semiconductor layer with the first type of dopant and a continuously varying doping concentration decreasing from the bottom to the top thereof. Such continuous graded semiconductor structure can be formed by an epitaxy growth with proper chemical gas (or gases) in which the relative partial pressure of the dopant-associated chemical gas may decrease during the epitaxy growth process to form a graded doping profile.

Referring again to FIG. 3, after various semiconductor layers with graded doping concentration formed on the substrate, a plurality of isolation features 120 such as shallow trench isolation (STI) are formed in the semiconductor layer 114 to define various regions for making image sensors, various transistors, and other functional features. The shallow trench isolation features 120 may be formed by a suitable technique known in the art. For example, the STI features may be formed by a set of processes including patterning the semiconductor layer by a conventional photolithography, etching the semiconductor layer by a plasma etching process to form various trenches, and filling the trenches by a dielectric material such as silicon oxide by a chemical vapor deposition (CVD) process. The CVD process may utilize a high density plasma CVD (HDPCVD) to achieve a better planar surface of the STI features. In another embodiment, the isolation features may be extended to other semiconductor layers underlying the semiconductor layer 114.

Figure 3:
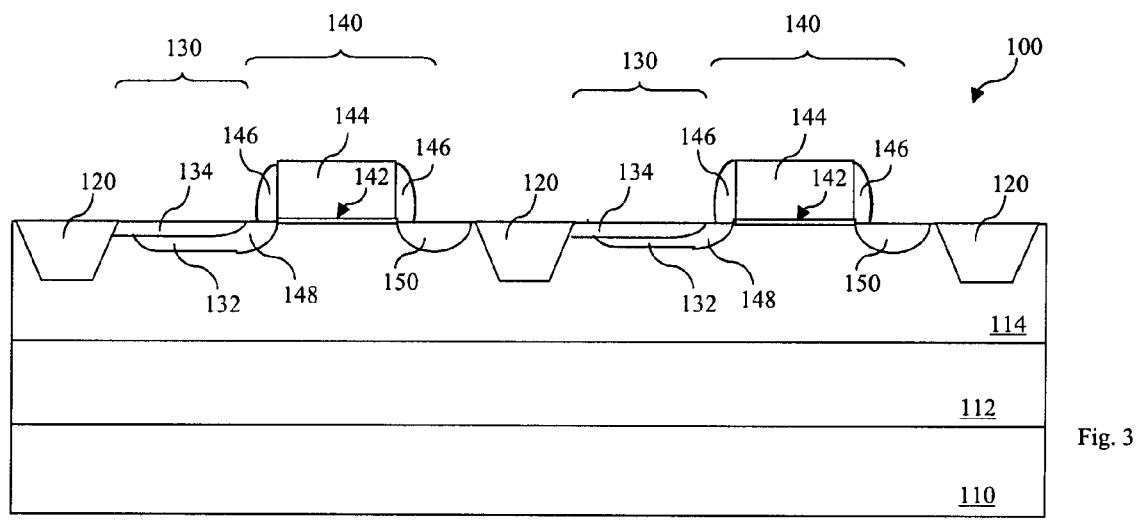

Still referring to FIG. 3, various photodiodes 130 are formed in the semiconductor layer 114. Each of the photodiodes 130 includes a first doped region 132 formed in the second semiconductor layer 114, wherein the first doped region 132 is a second type of dopant different from the first type of dopant. For example, when the second semiconductor layer 114 is N-type doped, then the first doped region 132 is positive type (P-type). Boron or $BF_2$ may be utilized to introduce P-type dopants. The first doped region 132 may have a thickness more than about 0.3 micrometer. In one example, the first doped region 132 has a thickness ranging between about 0.3 micrometer and about 1.5 micrometer. The first doped region 132 may have a doping concentration ranging between about $10^{17}$ $cm^{-3}$ and about $10^{19}$ $cm^{-3}$. The first doped region 132 may be formed by an implant or diffusion process known in the art.

The photodiodes 130 may further include a second doped region 134 with the first type of dopant, same to those of the first and second semiconductor layers 112 and 114, formed in the first doped region 132. The second doped region 134 may be extended to have a direct contact to the second semiconductor layer 114. The second doped region 134 may have a thickness less than about 0.1 micrometer. The second doped region 134 may have a doping concentration ranging between about $10^{17}$ $cm^{-3}$ and about $10^{19}$ $cm^{-3}$. The second doped region 134 may be formed by an implant or diffusion process known in the art. As examples, The n-type impurity such as phosphorus or arsenic can be introduced into the semiconductor layer using an ion implantation process to form n-type second doped region. The p-type impurity such as boron or $BF_2$ may be introduced to form p-type second doped region.

Various transistors may be formed in the second semiconductor layer 114, such as metal-oxide-semiconductor (MOS) transistors 140 as illustrated in FIG. 3. Each of the transistor 140 includes a gate dielectric 142 disposed on the second semiconductor layer 144, a gate electrode 144 disposed on the gate dielectric 142, and optional gate spacers 144 disposed on the sides of the gate stack (the gate dielectric and gate electrode). Each of the transistor 140 also includes doped a source (S) and a drain (D) regions 148 and 150. The S/D region 148 of each transistor 140 may be coupled with the first doped region 132 of associated photodiode 130 and be formed simultaneously. The source and drain regions have the second type of dopant. In one embodiment, the transistor 140 may be used as a transfer gate transistor. Alternatively, the various transistors may include a combination of a transfer gate transistor, a reset gate transistor, a source follower and a row select transistor.

Other features may also be present. For example, a multi-layer interconnect (MLI) structure and dielectric layers separating the MLI structure are formed on the semiconductor layer 114 and configured with proper connections to form designed circuit to enable various image sensors. Various color filters and/or microlenses may be formed and configured such that each image sensor (e.g. a photodiode) is operable to receive light for achieve imaging function.

The image sensor semiconductor devices provided above utilize multiple semiconductor layers with graded doping concentration and can have optimized imaging effect with reduced crosstalk and image lag and with increased imaging sensitivity. The disclosed image sensor semiconductor device and the method making the same may have various modifications, alternatives, and variations. The semiconductor device 100 includes exemplary N-channel transistors. However, the semiconductor device 100 may additionally or alternatively include one or more P-channel transistor if desired. In one example, well regions may be formed in the second semiconductor layer configured to have various P-type and/or N-type transistors formed therein. For example, various N-wells may be formed in the second semiconductor layer of P-type and be configured such that various n-channel transistors can be formed in those N-wells. The formation of the various wells may implement forming a patterned photoresist layer and performing an ion implantation process to the semiconductor layer within the openings of the patterned photoresist layer. The ion implantation process may utilize boron and/or phosphorous as doping impurities. In another embodiment, the type of dopant in the substrate 110 may be the different from the type of dopant used to form the first and second epitaxy semiconductor layers 112 and 114. For example, the semiconductor substrate 110 is N-type and the epitaxy semiconductor layers are P-type or vice versa. In another embodiment, various semiconductor layers may utilize various semiconductor materials to achieve strained effect for enhanced mobility. For example, a silicon substrate may incorporate one or more silicon germanium layers each interposed between other silicon layers (and/or the silicon substrate) with a graded doping profile formed by an epitaxy growth through multiple epitaxy steps. In another embodiment, semiconductor epitaxy layers with the type of dopant same to that of the semiconductor substrate 110 are formed in predefined regions and semiconductor epitaxy layers of the opposite type of dopant are formed in other regions such that various photodiodes and transistors can be formed in different regions defined above. In the disclosed structures and the methods to make the same, an illuminated light that the semiconductor device 100 to be received during applications may not be limited to visual light beam, but can be extended to other optical light such as infrared (IR) and ultraviolet (UV), and other proper radiation beam. Accordingly, the sensor element and various transistors may be properly designed and configured for effectively reflecting and/or absorbing the corresponding radiation beam. The semiconductor device 100 may include a passivation layer disposed over the MLI. The semiconductor device 100 may be designed for front-side or back-side illumination. The semiconductor device 100 may be thinned and further be bonded to another substrate.

Figure 6:
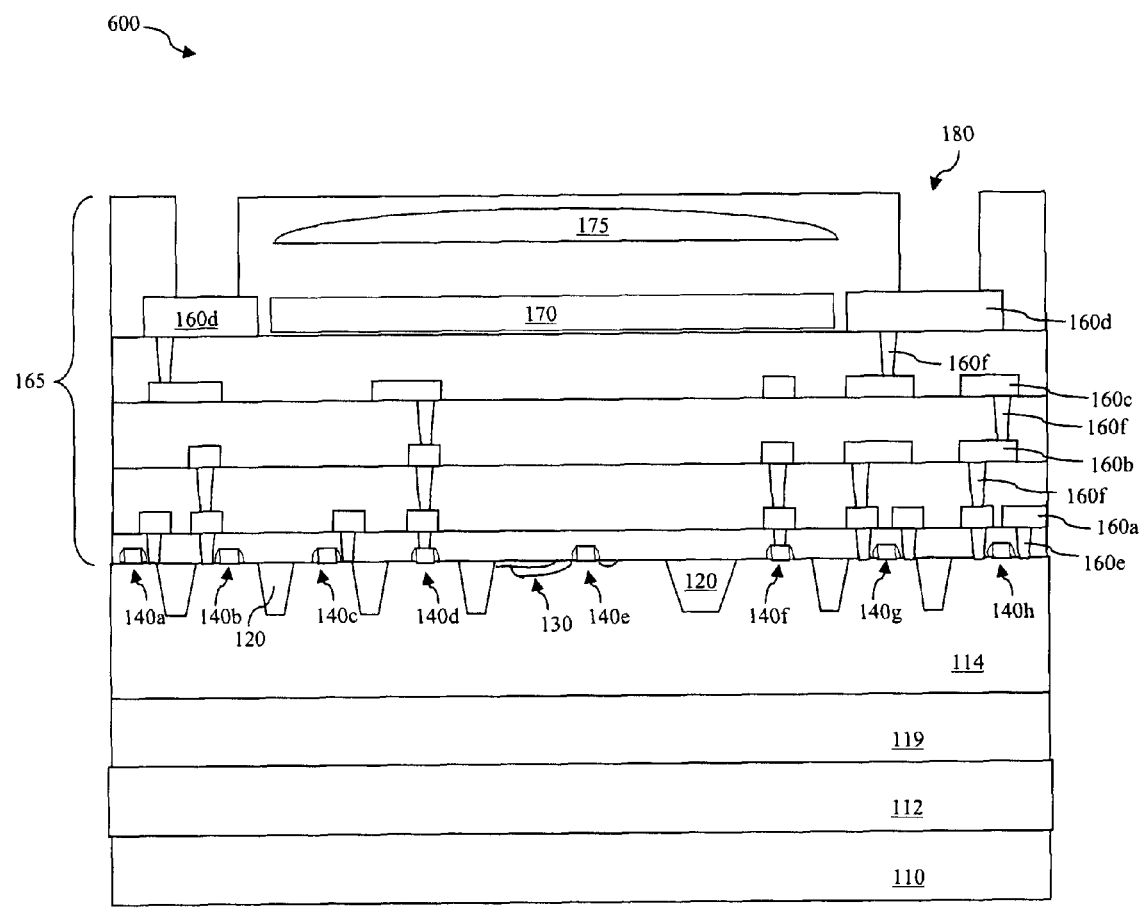
FIG. 6 illustrates a sectional view of a semiconductor device in one embodiment constructed according to aspects of the present disclosure.

FIG. 6 illustrates another embodiment of image sensor semiconductor device 600 constructed according to aspects of the present disclosure. The semiconductor device 600 includes a semiconductor substrate 110 and various semiconductor layers, such as exemplary semiconductor layers 112, 114 and 119, formed on the semiconductor substrate 110 with a graded doping profile such that the doping concentration changes vertically from a higher doping level in the semiconductor substrate 110 up to a lower doping level in the semiconductor layer 114, in a discrete or continuous gradient, formed by an epitaxy growth in various steps, such as those described above, or other proper fabrication technologies. In various embodiments, the multiple semiconductor layers may be substantially similar to one of those illustrated in FIGS. 3-5. The doping type of the semiconductor substrate 110 may be the same type of dopant as that of the semiconductor layers or alternatively opposite to the type of dopant of the semiconductor layers. In one example, the doping concentration in the semiconductor layers may have a graded profile from about $10^{18}$ cm$^{-3}$ in the substrate 110 up to about $10^{13}$ cm$^{-3}$ in the semiconductor layer 114.

Various photodiodes, such as the photodiodes of FIG. 3, are formed in the semiconductor layer 114. As one example, an n-type photodiode 130 is formed in the p-type semiconductor layer 114. The n-type impurity such as phosphorus or arsenic can be introduced into the p-type semiconductor layer 114 using an ion implantation process. A p-type doped region, also referred to as a p-type pinned layer, is formed in the photodiode 130 using p-type impurity such as boron or $BF_2$. The pinned layer helps to achieve better optical performance such as low leakage current.

Various transistors 140 are formed in the semiconductor layer 114. The various transistors may include a transfer gate transistor, a reset gate transistor, a source follower, a row select transistor, and may further include other MOS transistors and/or other active and passive IC features. Each transistor may include a source, a drain and a gate, wherein the gate further include a gate dielectric and a gate electrode. In one embodiment, transistor 140a is an exemplary NMOS transistor, 140b a row select transistor, 140c a source follower transistor, 140d a reset gate transistor, 140e a transfer gate transistor coupled with the photodiode 130, 140f, 145g and 145h are other exemplary transistors.

Still referring to FIG. 6, other features such as a multi-layer interconnect (MLI) structure 160 and a dielectric layer 165 separating the MLI structure are formed on the semiconductor layer 114. In one example, the MLI structure 160 includes exemplary metal layer one 160a, metal layer two 160b, metal layer three 160c, and top metal 160d. The MLI structure 160 further includes a contact 160e to connect the various features on the semiconductor layer and the metal layer one. The MLI structure 160 further includes a via 160f to connect between metal layers. The dielectric layer 165 is formed within the MLI structure and may include multiple layers such as inter-level dielectric and inter-metal dielectric.

The multilayer interconnect may include conductive materials such as aluminum, aluminum/silicon/copper alloy, titanium, titanium nitride, tungsten, polysilicon, metal silicide, or combinations, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line). Still other manufacturing processes such as thermal annealing may be used to form metal silicide. Alternatively, a copper multilayer interconnect may be used and include copper, copper alloy, titanium, titanium nitride, tantalum, tantalum nitride, tungsten, polysilicon, metal silicide, or combinations. The copper multilayer interconnect may be formed by a technique such as CVD, sputtering, plating, or other suitable processes. The metal silicide used in multilayer interconnects may include nickel silicide, cobalt silicide, tungsten silicide, tantalum silicide, titanium silicide, platinum silicide, erbium silicide, palladium silicide, or combinations thereof.

The dielectric layer is configured to isolate the multilayer interconnect disposed therein. The dielectric layer can be a material of a low dielectric constant such as a dielectric constant less than about 3.5. The dielectric layer may include silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layer may be formed by a technique including spin-on, CVD, sputtering, or other suitable processes. The MLI and dielectric layer may be formed in an integrated process such as a damascene process or lithography/plasma etching process.

A color filter 170 and a microlens 175 may also be formed on the substrate and are properly configured operable to collect optical light and filter there through, respectively and direct the light to the photodiode 150. Openings 180 may be further formed to expose the top metal layer for bonding pads to be formed therein.

The image sensor device 600 and the method of making the same may have other embodiments, alternatives, and variations. For example, the above provided embodiment includes a semiconductor substrate, multiple semiconductor layers, transistors, and photodiodes of certain doping types and doping profiles. In an alternative embodiment, a p-type semiconductor substrate and n-type semiconductor layers may be used. All other doping type may be reversed accordingly for proper configuration and functionality. Furthermore, the substrate may be electrically biased to a negative voltage to generate a depletion region during applications. In another embodiments, depending on the number of semiconductor layers utilized, the corresponding doping concentrations may be tuned differently for optimized imaging effect.

Examples of image sensor 130 may alternatively include charged coupling device (CCD) sensors, active sensor, passive sensor, and/or other devices diffused or otherwise formed in the substrate 110. As such, the image sensor 130 may comprise conventional and/or future-developed image sensing devices. The semiconductor device 600 may include a plurality of sensor elements disposed in an array or other proper configuration. The plurality of sensor elements may be designed to have various sensor types. For example, one group of sensor elements may be CMOS image sensors and another group of sensor elements may be passive sensors. Moreover, the sensor elements may include color image sensors and/or monochromatic image sensors.

Thus, the present disclosure provides an image sensor semiconductor device. The semiconductor device includes a semiconductor substrate; a first epitaxy semiconductor layer disposed on the semiconductor substrate and having a first type of dopant and a first doping concentration; a second epitaxy semiconductor layer disposed over the first epitaxy semiconductor layer and having the first type of dopant and a second doping concentration less than the first doping concentration; a third epitaxy semiconductor layer disposed over the second epitaxy semiconductor layer and having the first type of dopant and a third doping concentration less than the second doping concentration; and a metal-oxide-semiconductor (MOS) transistor formed on the third epitaxy semiconductor layer.

The semiconductor device may further include a photosensitive unit formed on the third epitaxy semiconductor layer and coupled with the MOS transistor. In one embodiment of the semiconductor device, the MOS transistor is N-type; the semiconductor substrate includes an N-type of dopant; and the first type of dopant for the first, second and third epitaxy semiconductor layers is P-type. In another embodiment of the semiconductor device, the MOS transistor is P-type; the semiconductor substrate includes a P-type of dopant; and the first type of dopant for the first, second and third epitaxy semiconductor layers is N-type. In another embodiment of the semiconductor device, the MOS transistor is N-type; the semiconductor substrate includes a P-type of dopant; and the first type of dopant for the first, second and third epitaxy semiconductor layers is P-type. In still another embodiment of the semiconductor device, the MOS transistor is P-type; the semiconductor substrate includes a N-type of dopant; and the first type of dopant for the first, second and third epitaxy semiconductor layers is N-type. Each of the first, second and third epitaxy semiconductor layers may include a thickness greater than about 0.2 microns. In further various embodiments of the semiconductor device, the first doping concentration includes a ranges between about $10^{16}$ and about $10^{18}$ atom/cm$^3$; the second doping concentration includes a ranges between about $10^{14}$ and about $10^{16}$ atom/cm$^3$; the third doping concentration includes a ranges between about $10^{13}$ and about $10^{15}$ atom/cm$^3$; and the semiconductor substrate includes a fourth doping concentration greater than about $10^{18}$ atom/cm$^3$.

The present disclosure also provides another embodiment of an image sensor semiconductor device. The semiconductor device includes a semiconductor substrate; a first epitaxy semiconductor layer disposed on the semiconductor substrate and having a first type of dopant and a first doping concentration; a second epitaxy semiconductor layer disposed over the first epitaxy semiconductor layer and having the first type of dopant and a second doping concentration less than the first doping concentration; and an image sensor on the second epitaxy semiconductor layer.

The semiconductor device may further include a third epitaxy semiconductor layer disposed between the first and second epitaxy semiconductor layers and having the first type of dopant. The third epitaxy semiconductor layer may include a third doping concentration less than the first doping concentration and higher than the second doping concentration. The third doping concentration may range between about epitaxy semiconductor layer comprises a thickness ranging between about $10^{14}$ and about $10^{16}$ atom/cm$^3$. The third epitaxy semiconductor layer may include a graded dopant distribution with a highest doping concentration at its bottom surface and a lowest doping concentration at its top surface. The third epitaxy semiconductor layer may include a plurality of epitaxy semiconductor layers each has a doping concentration less than that of an underlying neighboring epitaxy semiconductor layer and greater than that of an overlying neighboring epitaxy semiconductor layer. The first doping concentration may range between about $10^{16}$ and about $10^{18}$ atom/cm$^3$ and the second doping concentration ranges between about $10^{13}$ and about $10^{15}$ atom/cm$^3$. Each of the first and second epitaxy semiconductor layers may include a thickness greater than about 0.2 microns. The image sensor may include a photodiode. The image sensor may include a first doped region of a second type of dopant and disposed in the second epitaxy semiconductor layer. The image sensor may further include a second doped region of the first type of dopant and disposed at least partially in the first doped region. The semiconductor device may further include various microelectronic units formed on the semiconductor substrate, wherein the various microelectronic units include one selected from the group consisting of a transfer gate transistor, a reset gate transistor, a source follower transistor, a row select transistor, an negative metal-oxide-semiconductor transistor (NMOS), a positive metal-oxide-semiconductor transistor (PMOS), a microlens, a color filter and combinations thereof.

The present disclosure also provides an image sensor semiconductor device in another embodiment. The device includes a semiconductor substrate; a first silicon layer disposed on the semiconductor substrate and having a first type of dopant and a first doping concentration; a second silicon layer disposed over the first silicon layer and having the first type of dopant and a second doping concentration less than the first doping concentration; a third silicon layer disposed over the second silicon layer and having the first type of dopant and a third doping concentration less than the second doping concentration; and a photodiode formed at least partially in the third silicon layer.

In this semiconductor device, the photodiode may include a first doped region of the second type of dopant formed in the third silicon layer and a second doped region of the first type of dopant at least partially formed in the first doped region. The first, second, and third silicon layers each may be formed by an epitaxy process. The semiconductor substrate may include the first type of dopant. The third epitaxy semiconductor layer may include a thickness larger than about 0.5 micron. The semiconductor device may further include a color filter configured on the semiconductor substrate overlying the photodiode and substantially vertically aligned to the photodiode. The semiconductor device may further include a microlens disposed on the semiconductor substrate overlying the color filter and substantially vertically aligned to the photodiode.

The present disclosure also provides a method for fabricating an image sensor semiconductor device. The method includes forming, on a silicon substrate, a first epitaxy silicon layer of a first type of dopant and a first doping concentration; forming, on the first epitaxy silicon layer, a second epitaxy silicon layer of the first type of dopant and a second doping concentration less than the first doping concentration; and forming an image sensor in the second epitaxy silicon layer.

The method may further include forming a multi-layer interconnect (MLI) structure on the semiconductor layer; forming a color filter disposed on the MLI structure and vertically aligned with the image sensor; and forming a microlens disposed overlying the color filter and vertically aligned with the image sensor. The forming of the first or second epitaxy silicon layer may include implementing an epitaxy growth with a silane gas of a pressure ranging between about 40 and about 760 Torr and a growth temperature ranging between about 800° C. and about 1300° C. The epitaxy growth may further include implementing a gas selected from the group consisting of $B_2H_6$ and $PH_3$. The forming of the first or second epitaxy silicon layer may include implementing an ion implantation process utilizing the first type of dopant. The method may further include forming a third epitaxy silicon layer of the first type of dopant and a third doping concentration less than the first doping concentration and greater than the second doping concentration, wherein the third epitaxy silicon layer is disposed overlying the first epitaxy silicon layer and underlying the second epitaxy silicon layer. The forming of the image sensor may include forming a photodiode.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a semiconductor substrate;
   a first epitaxy semiconductor layer disposed on the semiconductor substrate and having a first type of dopant and a first doping concentration;
   a second epitaxy semiconductor layer disposed over the first epitaxy semiconductor layer and having the first type of dopant and a second doping concentration less than the first doping concentration;
   a third epitaxy semiconductor layer disposed over the second epitaxy semiconductor layer and having the first type of dopant and a third doping concentration less than the second doping concentration; and
   a photo-sensitive unit having a pinned layer and a metal-oxide-semiconductor (MOS) transistor formed on the third epitaxy semiconductor layer, wherein the photo-sensitive unit is coupled with the MOS transistor.

2. The device of claim 1, wherein each of the first, second and third epitaxy semiconductor layers comprises a thickness greater than about 0.2 microns.

3. The device of claim 1, wherein
   the first doping concentration includes a range between about $10^{16}$ and about $10^{18}$ atom/cm$^3$;
   the second doping concentration includes a range between about $10^{14}$ and about $10^{16}$ atom/cm$^3$;
   the third doping concentration includes a range between about $10^{13}$ and about $10^{15}$ atom/cm$^3$; and
   the semiconductor substrate includes a fourth doping concentration greater than about $10^{18}$ atom/cm$^3$.

4. The device of claim 1, wherein:
   the photo-sensitive unit includes a doped region having a second type of dopant opposite the first type of dopant;
   the doped region and third epitaxy semiconductor layer form a photodiode for photo-sensing; and
   the pinned layer formed on the doped region, including the first type of dopant and extended to contact the third epitaxy semiconductor layer directly.

5. The device of claim 4, wherein the pinned layer includes a doping concentration greater than the third doping concentration.

6. The device of claim 4, wherein the doped region directly connects to a source region of the MOS transistor, and the source region includes the second type of dopant.

7. The device of claim 6, wherein the doped region and source region include a same doping concentration.

8. A semiconductor device, comprising:
   a semiconductor substrate;
   a first epitaxy semiconductor layer disposed on the semiconductor substrate and having a first type of dopant and a first doping concentration;
   a second epitaxy semiconductor layer disposed over the first epitaxy semiconductor layer and having the first type of dopant and a second doping concentration less than the first doping concentration;
   a third epitaxy semiconductor layer disposed between the first and second epitaxy semiconductor layers and having the first type of dopant and a third doping concentration that is different than the first and second doping concentrations; and
   an image sensor on the second epitaxy semiconductor layer.

9. The device of claim 8, wherein the third epitaxy semiconductor layer comprises the third doping concentration less than the first doping concentration and higher than the second doping concentration.

10. The device of claim 8, wherein the third epitaxy semiconductor layer comprises a graded dopant distribution with a first doping concentration at its bottom surface and a second doping concentration at its top surface, the first doping concentration being greater than the second doping concentration.

11. The device of claim 8, wherein the third epitaxy semiconductor layer comprises a plurality of epitaxy layers each having a doping concentration less than that of an underlying adjacent epitaxy semiconductor layer and greater than that of an overlying adjacent epitaxy semiconductor layer.

12. The device of claim 8, wherein the first doping concentration ranges between about $10^{16}$ and about $10^{18}$ atom/cm$^3$ and the second doping concentration ranges between about $10^{13}$ and about $10^{15}$ atom/cm$^3$.

13. The device of claim 8, further comprising;
   a MOS transistor on the second epitaxy semiconductor layer;
   wherein the image sensor includes a pinned layer, and the image sensor directly contacts a source/drain (S/D) region of the MOS transistor.

14. The device of claim 8, wherein the image sensor comprises a photodiode.

15. The device of claim 14, further comprising a pinned layer disposed on the photodiode, the pinned layer extending to contact the second epitaxy semiconductor layer.

16. A semiconductor device, comprising:
   a semiconductor substrate;
   a first silicon layer disposed on the semiconductor substrate and having a first type of dopant and a first doping concentration;
   a second silicon layer disposed over the first silicon layer and having the first type of dopant and a second doping concentration less than the first doping concentration;
   a third silicon layer disposed over the second silicon layer and having the first type of dopant and a third doping concentration less than the second doping concentration;
   a photodiode formed at least partially in the third silicon layer; and
   a pinned layer disposed on the photodiode and extended to directly contact the third silicon layer.

17. The device of claim 16, wherein the photodiode includes a first doped region of a second type of dopant formed in the third silicon layer and the pinned layer includes a second doped region of the first type of dopant partially formed in the first doped region.

18. The device of claim 16, wherein the third silicon layer includes a thickness larger than about 0.5 micron.

19. The device of claim 16, further comprising:
   a color filter disposed on the semiconductor substrate overlying the photodiode and substantially vertically aligned to the photodiode; and
   a microlens disposed overlying the color filter and substantially vertically aligned to the color filter and the photodiode.

20. The device of claim 16, wherein the pinned layer is extended to directly contact the third silicon layer.

* * * * *